(12) United States Patent
Kumar et al.

(10) Patent No.: US 8,427,223 B2
(45) Date of Patent: Apr. 23, 2013

(54) VOLTAGE LEVEL TRANSLATOR CIRCUIT FOR REDUCING JITTER

(75) Inventors: Pankaj Kumar, Bangalore (IN); Pramod Parameswaran, Bangalore (IN); Makeshwar Kothandaraman, Bangalore (IN)

(73) Assignee: LSI Corporation, San Jose, CA (US)

( * ) Notice: Subject to any disclaimer, the term of this patent is extended or adjusted under 35 U.S.C. 154(b) by 5 days.

(21) Appl. No.: 13/186,310

(22) Filed: Jul. 19, 2011

(65) Prior Publication Data

US 2013/0021085 A1    Jan. 24, 2013

(51) Int. Cl.
*H03L 5/00* (2006.01)
(52) U.S. Cl.
USPC .......................................... 327/333; 327/319
(58) Field of Classification Search .................. 327/333, 327/54, 55, 57, 65, 67, 317, 319, 378, 403, 327/404
See application file for complete search history.

(56) References Cited

U.S. PATENT DOCUMENTS

| | | | | |
|---|---|---|---|---|
| 5,128,555 A | * | 7/1992 | Millman | 326/88 |
| 5,231,395 A | * | 7/1993 | Irwin et al. | 341/143 |
| 7,038,521 B2 | * | 5/2006 | Cleary et al. | 327/333 |
| 7,301,386 B2 | * | 11/2007 | Chen et al. | 327/333 |
| 7,663,403 B2 | * | 2/2010 | Cho et al. | 326/81 |
| 2005/0258887 A1 | * | 11/2005 | Ito et al. | 327/333 |
| 2010/0176864 A1 | * | 7/2010 | Yoo | 327/333 |
| 2011/0074484 A1 | * | 3/2011 | Koo | 327/306 |
| 2011/0187431 A1 | * | 8/2011 | Bhattacharya et al. | 327/210 |

* cited by examiner

*Primary Examiner* — Lincoln Donovan
*Assistant Examiner* — Jung H Kim
(74) *Attorney, Agent, or Firm* — Otterstedt, Ellenbogen & Kammer, LLP (57) ABSTRACT

A voltage level translator circuit for translating an input signal referenced to a first voltage supply to an output signal referenced to a second voltage supply includes an input stage for receiving the input signal, the input stage including at least first and second nodes, a voltage at the second node being a logical complement of a voltage at the first node. A load circuit is coupled with the input stage, the load circuit being operative to at least temporarily store a signal at the first and/or second nodes which is indicative of a logical state of the input signal. An output stage connected with the second node is operative to generate an output signal which is indicative of a logical state of the input signal. The voltage level translator circuit further includes a compensation circuit connected with the output stage and operative to balance pull-up and pull-down propagation delays in the voltage level translator circuit as a function of a voltage at the first node.

21 Claims, 4 Drawing Sheets

VOLTAGE LEVEL TRANSLATOR CIRCUIT FOR REDUCING JITTER

FIELD OF THE INVENTION

The present invention relates generally to electrical and electronic devices and circuits, and more particularly relates to voltage level translation circuits.

BACKGROUND OF THE INVENTION

In modern electronic circuits, such as, for example, high-speed interface circuitry, receivers, transmitters, analog-to-digital and digital-to-analog converters, data recovery circuitry, etc., it is desirable to reduce the variation in received clock signals. Unfortunately, in practical systems, clock signals do not arrive precisely at the same time in a spatial or even temporal reference. A clock signal that arrives slightly out of phase at difference spatial locations is often referred to as being skewed. Similarly, jitter often refers to variation in the arrival of the clock signal relative to an average arrival time (e.g., clock period) from cycle to cycle; thus, jitter can be defined as the timing error of a digital signal.

When dealing with jitter in a given system, it is often useful to classify the different types of jitter that can occur. The composite, overall jitter associated with a data signal is typically referred to as total jitter. Total jitter may be thought of as being composed of a number of different components resulting from various noise and signal sources within the system. These jitter components are generally classified into two primary categories: deterministic jitter and random jitter. Most jitter components are not truly random in a statistical sense, and thus fall into the deterministic category. More particularly, most digital signals have regular time intervals at which voltage level transitions occur. When the digital signal is compared to an ideal periodic waveform, the effects of jitter are noticeable.

In an input/output (I/O) interface application (e.g., I/O buffer and driver circuitry), voltage level translation circuitry has been shown to be a primary contributor to total jitter in a system. Thus, by improving the performance of the interface circuitry, a significant reduction in overall jitter in the system can be advantageously achieved.

SUMMARY OF THE INVENTION

The present invention, in illustrative embodiments thereof, relates to techniques balancing pull-up and pull-down propagation delays in a voltage level translator circuit across variations in integrated circuit (IC) process, supply voltage and/or temperature (PVT) conditions to which the voltage level translator circuit may be subjected. In this manner, jitter is substantially reduced, among other advantages, particularly in jitter-sensitive applications in which the voltage level translator circuit may be used.

In accordance with an embodiment of the invention, a voltage level translator circuit for translating an input signal referenced to a first voltage supply to an output signal referenced to a second voltage supply includes an input stage for receiving the input signal, the input stage including at least first and second nodes, a voltage at the second node being a logical complement of a voltage at the first node. A load circuit is coupled with the input stage, the load circuit being operative to at least temporarily store a signal at the first and/or second nodes which is indicative of a logical state of the input signal. An output stage connected with the load circuit at the second node is operative to generate an output signal of the voltage level translator circuit which is indicative of a logical state of the input signal. The voltage level translator circuit further includes a compensation circuit connected with the output stage and operative to balance pull-up and pull-down propagation delays in the voltage level translator circuit as a function of a voltage at the first node.

In accordance with another embodiment of the invention, an integrated circuit includes at least one voltage level translator circuit for translating an input signal referenced to a first voltage supply to an output signal referenced to a second voltage supply. The voltage level translator circuit includes an input stage for receiving the input signal, the input stage including at least first and second nodes, a voltage at the second node being a logical complement of a voltage at the first node. A load circuit is coupled with the input stage, the load circuit being operative to at least temporarily store a signal at the first and/or second nodes which is indicative of a logical state of the input signal. An output stage connected with the load circuit at the second node is operative to generate an output signal of the voltage level translator circuit which is indicative of a logical state of the input signal. The voltage level translator circuit further includes a compensation circuit connected with the output stage and operative to balance pull-up and pull-down propagation delays in the voltage level translator circuit as a function of a voltage at the first node.

In accordance with yet another embodiment of the invention, an electronic system includes one or more integrated circuits comprising at least one voltage level translator circuit operative to translate an input signal referenced to a first voltage supply to an output signal referenced to a second voltage supply according to inventive techniques set forth herein.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to aspects thereof, will be described herein in the context of illustrative voltage level translator circuits (i.e., voltage level shifters) adapted to improve jitter performance in applications in which the voltage level translator circuits are used. It should be understood, however, that the present invention is not limited to these or any other particular circuit configurations. Rather, the invention is more generally applicable to techniques for balancing pull-up and pull-down propagation delays in a voltage level translator circuit across variations in integrated circuit (IC) process, supply voltage and/or temperature (PVT) conditions to which the voltage level translator circuit may be subjected. In this manner, jitter is substantially reduced, among other advantages, particularly in jitter-sensitive designs in which the voltage level translator circuit may be used. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., MOSFETs), as well as those that do not. In addition, despite a reference to the term "metal" in the acronym MISFET, the term MISFET is also intended to encompass semiconductor field effect transistors wherein the gate is formed from a non-metal such as, for instance, polysilicon.

Although implementations of the present invention described herein may be implemented using p-channel MISFETs (hereinafter called "PMOS" (p-channel metal-oxide-semiconductor) devices) and n-channel MISFETs (hereinafter called "NMOS" (n-channel metal-oxide-semiconductor) devices), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, with or without modification to the circuits described herein, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
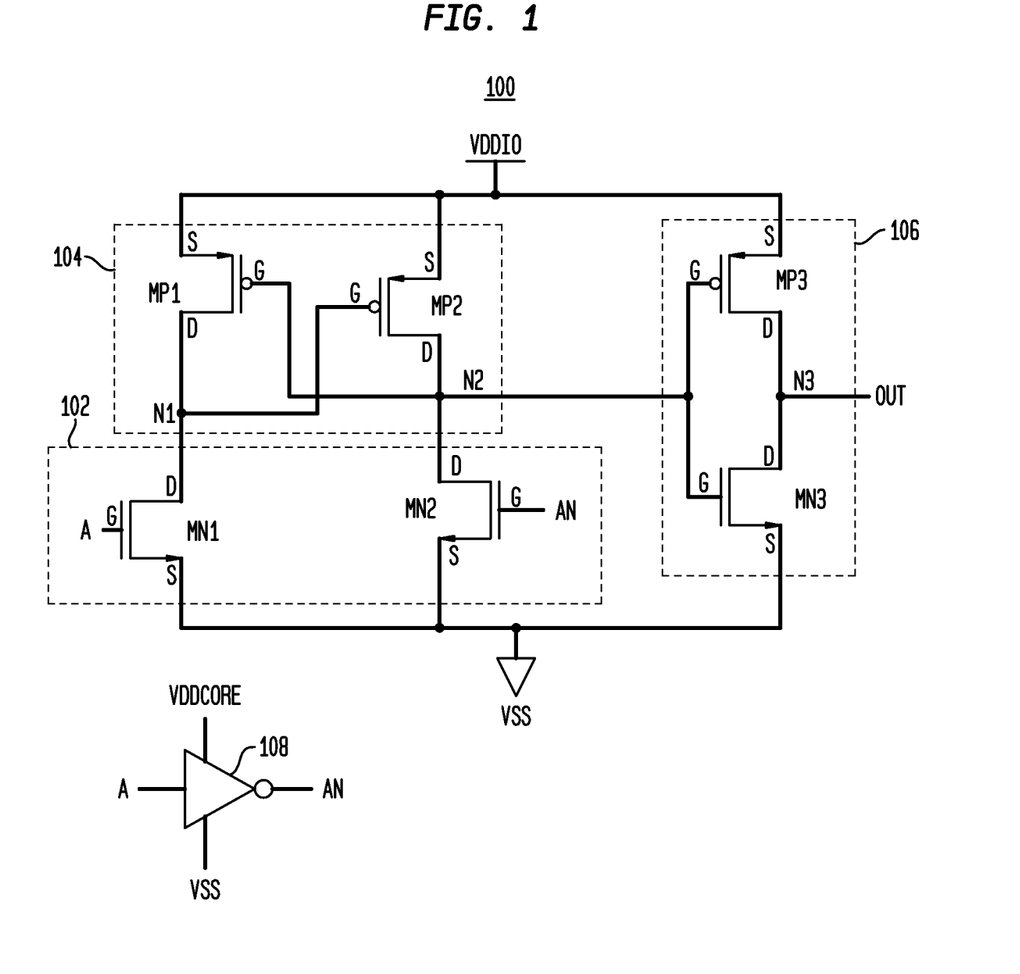
FIG. 1 is a schematic diagram depicting at least a portion of an exemplary voltage level translator circuit which can be modified to implement techniques of the present invention.

FIG. 1 is a schematic diagram depicting at least a portion of an exemplary voltage level translator (i.e., voltage level shifter) circuit 100 which can be modified to implement techniques of the present invention. Voltage level translator circuit 100 preferably comprises an input stage 102 including a pair of NMOS transistor devices, MN1 and MN2, adapted for connection with a first voltage supply, which may be VDDIO (e.g., 3.0 volts), via a load circuit 104. It is to be understood that the invention is not limited to any specific voltage supply levels. Load circuit 104 preferably comprises a pair of PMOS transistor devices, MP1 and MP2, connected in a cross-coupled latch arrangement. An output stage 106 of the voltage level translator circuit 100 is coupled with input stage 102 and load circuit 104. Output stage 106 preferably includes an NMOS transistor device, MN3, and a PMOS transistor device, MP3, connected together in an inverter configuration.

More particularly, input stage 102 comprises a first NMOS transistor MN1 including a source (S) adapted for connection with a second voltage supply, which may be VSS (e.g., 0 volts or ground), a gate (G) adapted to receive a first input signal, A, and a drain (D) connected with the load circuit 104 at node N1. A second NMOS transistor MN2 in input stage 102 includes a source adapted for connection with VSS, a gate adapted to receive a second input signal, AN, and a drain connected with the load circuit 104 at node N2. The second input signal AN may be a logical complement of the first input signal A and can be generated, for example, using an inverter 108, or alternative signal generation means. Input signals A and AN may be referenced to a voltage source which is different than the voltage supplied to the voltage level translator circuit. For example, input signals A and AN may be referenced to a core supply, VDDCORE (e.g., 1.0 volts), while the voltage level translator circuit 100 may be operating from an input/output supply, VDDIO (e.g., 3.0 volts). As previously stated, the invention is not limited to any specific voltage supply levels.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Load circuit 104 comprises first and second PMOS transistors MP1 and MP2, respectively. Sources of transistors MP1 and MP2 are adapted for connection with VDDIO, a drain of MP1 is connected with a drain of transistor MN1 at node N1, a drain of MP2 is connected with a drain of transistor MN2 at node N2, a gate of MP1 is connected with a drain of MP2 at node N2, and a gate of MP2 is connected with a drain of MP1 at node N1. The cross-coupled connection of the load transistors MP1 and MP2 allows load circuit 104 to function essentially as a latch operative to at least temporarily store a logical state of the voltage level translator circuit 100 at node N2. The signal at node N2 is preferably buffered by output stage 106, which in this illustrative example comprises an inverter. Specifically, output stage 106 includes PMOS transistor MP3 and NMOS transistor MN3 connected such that a source of MP3 is adapted for connection to VDDIO, a drain of MP3 is connected with a drain of MN3 and forms an output of the voltage level translator circuit 100 at node N3 for generating an output signal, Out, of the voltage level translator circuit, a source of MN3 is adapted for connection with VSS, and gates of MP3 and MN3 are connected with a junction of input stage 102 and load circuit 104 at node N2. It is to be appreciated, however, that in alternative embodiments, output stage 106 may instead comprise a non-inverting buffer.

In operation, when input signal A is a logic high level (e.g., 1.0 volt) and signal AN, being a logical complement of signal A is a logic low level (e.g., zero volt), transistor MN1 will be turned on and transistor MN2 will be turned off. With MN1 turned on, node N1 will be pulled down to about zero volts thereby turning on transistor MP2. With MP2 turned on, node N2 will be pulled up to about VDDIO, thereby turning off transistor MP1. With MN2 turned off, MP2 will be able to pull up node N2 essentially without any load. With node N2 pulled up, the output signal Out will be a logic low level. At this point, even when signals A and AN are removed, load circuit 104 will latch the logic state of the voltage level translator circuit 100 until an appropriate set of input signals are applied to input stage 102 to toggle the state of the voltage level translator circuit.

Conversely, when input signal A is a logic low level (e.g., zero volt) and signal AN is a logic high level (e.g., 1.0 volt), transistor MN1 will be turned off and transistor MN2 will be turned on. With MN2 turned on, node N2 will be pulled down to about zero volts thereby turning on transistor MP1. With MP1 turned on, node N1 will be pulled up to about VDDIO, thereby turning off transistor MP2. With MN1 turned off, MP1 will be able to pull up node N1 essentially without any load. With node N2 pulled down, the output signal Out will be a logic high level.

Inherently, because of the topology of the cross-coupled voltage level translator circuit 100, the circuit will generally react faster while pulling down compared to pulling up. This is due primarily to the fact that the NMOS transistor devices forming the input stage 102 are faster compared to the PMOS transistor devices forming load circuit 104. More particularly, the mobility of electrons, which are carriers in the case of an NMOS device, is about two times greater than that of holes, which are the carriers in a PMOS device. Since electron mobility is about twice that of hole mobility, an NMOS device will have about one-half the on-resistance or impedance of an equivalent PMOS device with comparable geometry and operating conditions. Thus NMOS devices need only half the size of PMOS devices to achieve the same impedance. NMOS devices also offer a speed advantage over PMOS devices due to their smaller junction areas. Since the operating speed of an MOS IC is largely limited by internal RC time constants and the capacitance of diode junctions are directly proportional to device size, an n-channel junction can have smaller capacitance; which, in turn, improves device speed. Accordingly, pull-up propagation delay through the voltage level translator circuit will be greater than pull-down propagation delay through the circuit. Additionally, in this exemplary architecture, pull-down will occur first and then pull-down will begin.

In order to compensate for this imbalance, output stage 106 can be skewed by a prescribed amount. For example, PMOS transistor MP3 can be sized (e.g., by selecting a desired channel width to channel length ratio) so as to be substantially greater than a size of NMOS transistor device MN3 (e.g., a ratio of PMOS size to NMOS size of about two of more). However, such compensation will be effective only for a relatively narrow set of PVT conditions under which the voltage level translator circuit 100 operates. For instance, the ratio of PMOS device speed to NMOS device speed will generally not be constant across prescribed PVT corners. Hence, jitter will not be consistent across a prescribed range of PVT variations.

Figure 2:
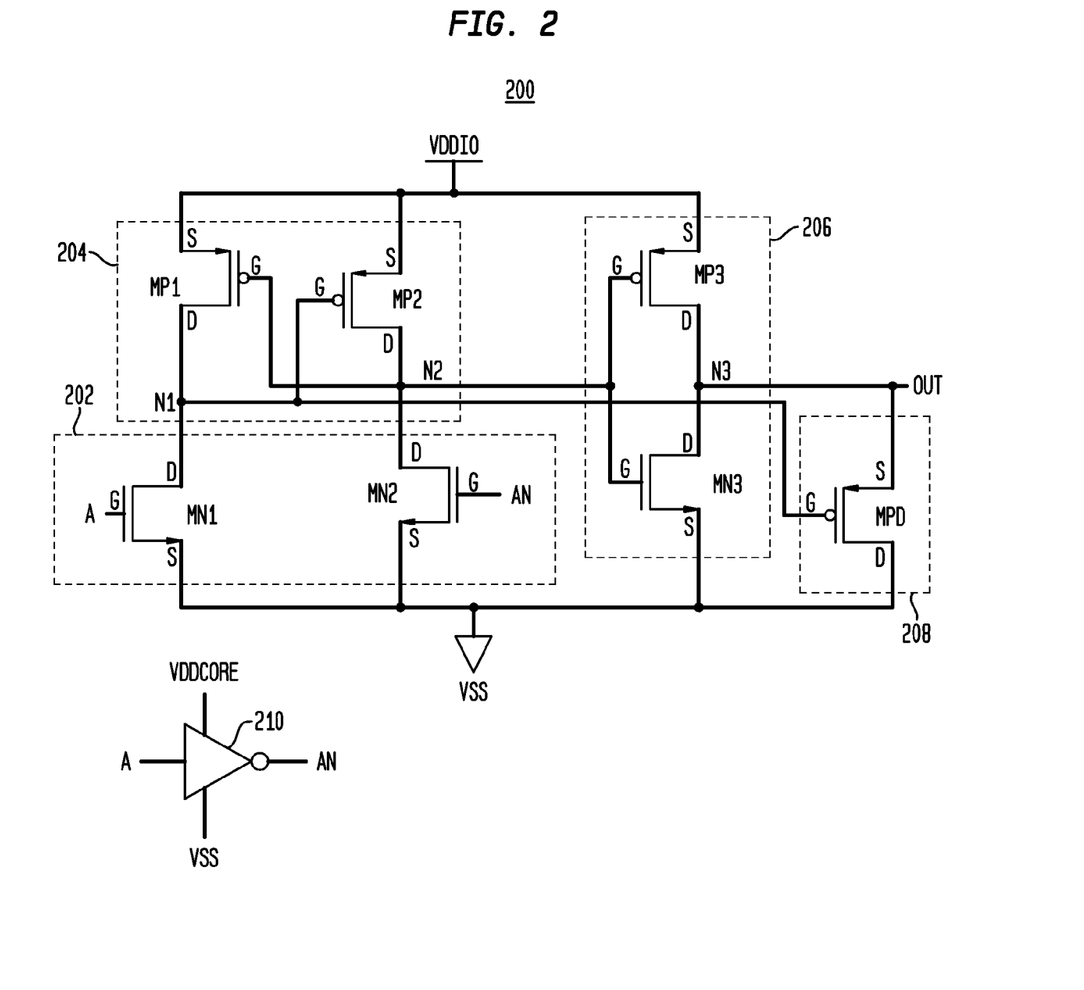
FIG. 2 is a schematic diagram depicting at least a portion of an exemplary voltage level translator circuit, according to an embodiment of the present invention.

FIG. 2 is a schematic diagram depicting at least a portion of an exemplary voltage level translator (i.e., voltage level shifter) circuit 200, according to the present invention. Voltage level translator circuit 200 preferably comprises an input stage 202 including a pair of NMOS transistor devices, MN1 and MN2, adapted for connection with a first voltage supply, which may be VDDIO (e.g., 3.0 volts), via a load circuit 204. It is to be understood that the invention is not limited to any specific voltage supply levels. Load circuit 204 preferably comprises a pair of PMOS transistor devices, MP1 and MP2, connected in a cross-coupled latch arrangement. An output stage 206 of the voltage level translator circuit 200 is connected with input stage 202 and load circuit 204 at a junction between the input stage and the load circuit. Output stage 206 preferably includes an NMOS transistor device, MN3, and a PMOS transistor device, MP3, connected together as an inverter. Voltage level translator circuit 200 further includes a compensation circuit 208 operative to balance pull-up and pull-down propagation delays in the voltage level translator circuit over a prescribed range of PVT variations to which the voltage level translator circuit 200 may be subjected.

More particularly, input stage 202 comprises first and second NMOS transistors MN1 and MN2, respectively. Sources of MN1 and MN2 are adapted for connection with a second voltage supply, which may be VSS (e.g., 0 volts or ground), a gate of MN1 is adapted to receive a first input signal, A, a drain of MN1 is connected with load circuit 204 at node N1, a drain of MN2 is connected with the load circuit at node N2, and a gate of MN2 is adapted to receive a second input signal, AN. The second input signal AN may be a logical complement of the first input signal A and can be generated, for example, using an inverter 210, or alternative signal generation means. It is to be appreciated that inverter 210 is preferably operative to generate signal AN having substantially the same rise and fall times as signal A. Although shown as a single inverter stage for simplicity, inverter 210 may comprise more than one inverter stage, as will become apparent to those skilled in the art.

As is typical in a voltage translation application, input signals A and AN may be referenced to a voltage source which is different than the voltage supplied to the voltage level translator circuit 200. For example, input signals A and AN may be referenced to a core supply voltage, VDDCORE (e.g., 1.0 volts), while the voltage level translator circuit 200 may be operating from an input/output supply, VDDIO (e.g., 3.0 volts). Alternatively, the voltage supply to which the input signals A and AN are referenced may be the same as or greater than the supply voltage of the voltage level translator circuit 200. As previously stated, the invention is not limited to any specific voltage supply levels.

Load circuit 204 preferably comprises first and second PMOS transistors MP1 and MP2, respectively. Sources of transistors MP1 and MP2 are adapted for connection with VDDIO, a drain of MP1 is connected with a drain of transistor MN1 in input stage 202 at node N1, a drain of MP2 is connected with a drain of transistor MN2 in the input stage at node N2, a gate of MP1 is connected with a drain of MP2 at node N2, and a gate of MP2 is connected with a drain of MP1 at node N1. The cross-coupled arrangement of the load transistors MP1 and MP2 allows load circuit 204 to at least temporarily store (e.g., latch) a logical state of the voltage level translator circuit 200. Input stage 202 and load circuit 204, together, may be considered a level shift stage of the voltage level translator circuit 200, with an output of the level shift stage being taken at node N2.

The signal generated by the level shift stage at node N2 is preferably buffered by output stage 206, which in this illustrative example comprises an inverter. Output stage 206 may also function to generate a buffered output signal (e.g., signal Out) of the voltage level translator circuit 200 having substantially rail-to-rail (e.g., VSS to VDDIO) logic levels. Specifically, output stage 206 includes PMOS transistor MP3 and NMOS transistor MN3. A source of transistor MP3 is adapted for connection to VDDIO, a drain of MP3 is connected with a drain of transistor MN3 and forms an output of the voltage level translator circuit 200 at node N3 for generating an output signal, Out, of the voltage level translator circuit, a source of MN3 is adapted for connection with VSS, and gates of MP3 and MN3 are connected with input stage 202 and load circuit 204 at node N2. Signal Out is indicative of the input signal(s) (e.g., signals A and AN) supplied to the voltage level translator circuit 200. It is to be appreciated, however, that in alternative embodiments, output stage 206 may instead comprise a non-inverting buffer. Furthermore, an input of the output stage 206 may be connected with the level shift stage at node N1, with output signal Out being the same logical state as input signal A.

Compensation circuit 208, in this illustrative embodiment, comprises a PMOS transistor, MPD, connected to the output of the voltage level translator circuit 200 at node N3 in a pull-down configuration. Specifically, transistor MPD includes a source connected with the output of the voltage level translator circuit 200 at node N3, a drain adapted for connection with VSS, and a gate connected with input stage 202 and load circuit 204 at node N1. Transistor MPD, being a PMOS device, will turn on when node N1 is pulled to VSS through transistor MN1, thereby facilitating the pulling down of output node N3. Operation of compensation circuit 208 will be described in further detail below.

When input signal A is a logic high level (e.g., 1.0 volt) and signal AN, being a logical complement of signal A is a logic low level (e.g., zero volt), transistor MN1 will turn on and transistor MN2 will turn off. With MN1 turned on, node N1 will be pulled down to about zero volts thereby turning on transistor MP2. With MP2 turned on, node N2 will be pulled up to about VDDIO, thereby turning off transistor MP1. With MN2 turned off, MP2 will be able to pull up node N2 essentially without any load. With node N2 pulled up, the output signal Out will be a logic low level through output stage 206. At this point, even when signals A and AN are removed, load circuit 204 will latch the logic state of the voltage level translator circuit 200 until an appropriate set of input signals are applied to input stage 202 to toggle the state of the voltage level translator circuit.

Conversely, when input signal A is a logic low level (e.g., zero volt) and signal AN is a logic high level (e.g., 1.0 volt), transistor MN1 will turn off and transistor MN2 will turn on. With MN2 turned on, node N2 will be pulled down to about zero volts thereby turning on transistor MP1. With MP1 turned on, node N1 will be pulled up to about VDDIO, thereby turning off transistor MP2. With MN1 turned off, MP1 will be able to pull up node N1 essentially without any load. With node N2 pulled down, the output signal Out will be a logic high level.

In practice, the level shift stage (comprising input stage 202 and load circuit 204) responds more quickly in a pull-down direction than in a pull-up direction. Therefore, when input signal A is a logic high level and input signal AN is a logic low level, node N1 will be pulled down to VSS faster than node N2 will be pulled up to VDDIO. Since output stage 206 is connected with node N2, the output signal Out will transition from high to low more slowly compared to a transition from low to high, thus creating an imbalance between pull-up and pull-down propagation delay in voltage level translator circuit 200. This imbalance between pull-up and pull-down propagation delays can produce undesirable jitter in an application in which the voltage level translator circuit 200 is used.

Compensation circuit 208 is operative to correct the imbalance between pull-up and pull-down propagation delays in voltage level translator circuit 200. Specifically, transistor MPD is controlled by the voltage appearing at node N1 rather than the voltage at node N2. Thus, as soon as node N1 is pulled to at least a threshold voltage below the output signal at node N3 (e.g., about VDDIO–$V_T$, where $V_T$ represents a high voltage MOS transistor threshold voltage), transistor MPD will turn on and begin to pull down the output node N3 without having to wait for transistor MN3 in output stage 206 to turn on. In the opposite direction, when signal Out transitions from low to high, transistor MPD, being controlled by node N1, will turn off more slowly, thus slowing the release of node N3 (i.e., MPD will provide some resistance as transistor MP3 in output stage 206 tries to pull up output node N3). In this manner, transistor MPD will delay the transition of the output signal Out from low to high and speed the transition of the output signal from high to low, thereby beneficially providing pull-up and pull-down propagation delays that are more closely matched to one another.

Figure 3:
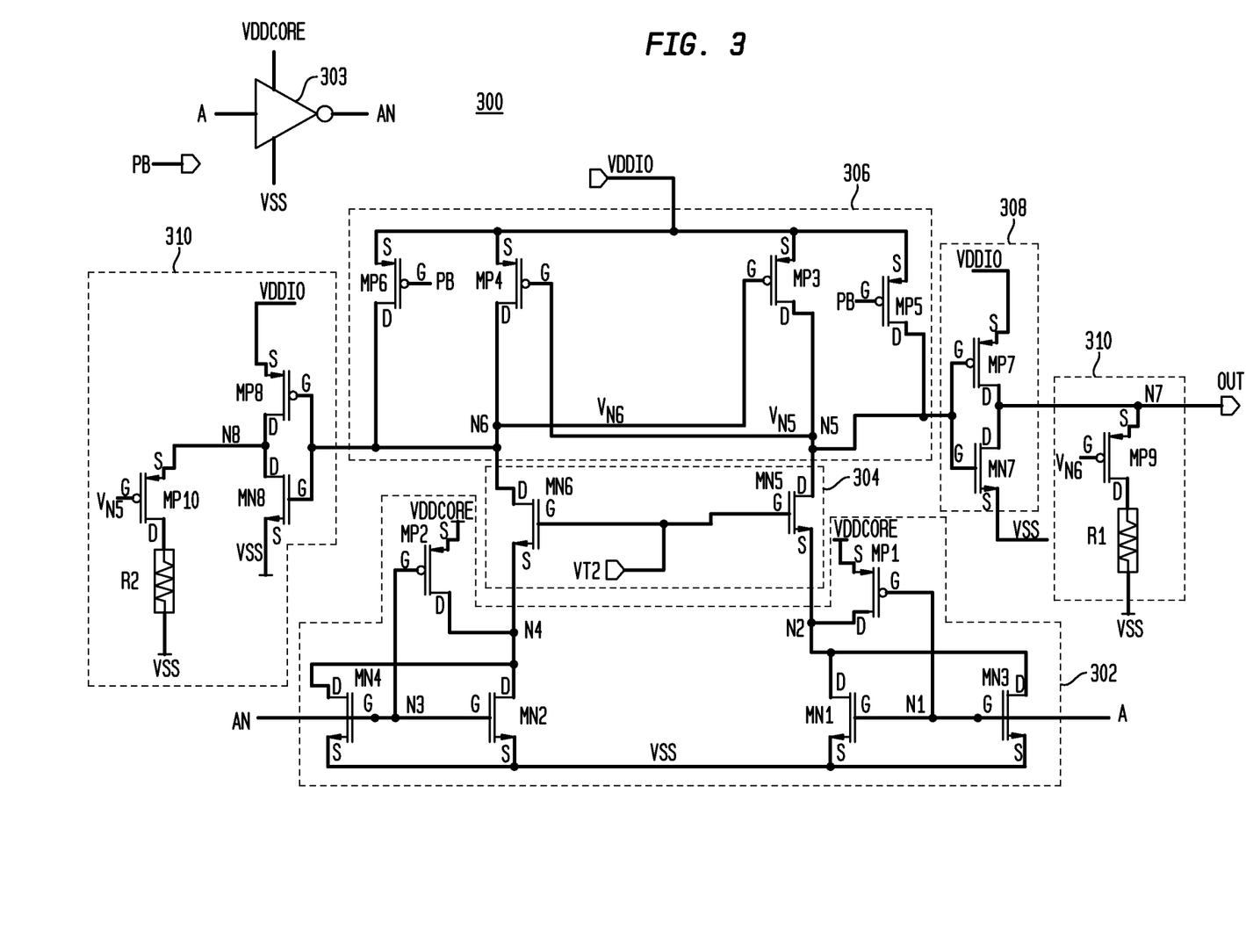
FIG. 3 is a schematic diagram depicting at least a portion of an exemplary voltage level translator circuit, according to another embodiment of the present invention.

With reference now to FIG. 3, a schematic diagram depicts at least a portion of an exemplary voltage level translator (shifter) circuit 300, according to another embodiment of the invention. Compared to voltage level translator circuit 200 shown in FIG. 2, voltage level translator circuit 300 represents a more robust implementation which can provide improved matching of pull-up and pull-down propagation delays, and thereby further reduce jitter. Additionally, voltage level translator circuit 300 has less delay compared to the voltage level translator circuit 200 shown in FIG. 2. As will be described in further detail below, an added benefit of voltage level translator circuit 300 is that core transistor devices may be employed in an input stage 302 of the voltage level translator circuit 300 (e.g., for devices MN1 and MN2), since cascaded device MN5 and MN6 are operative to limit the drain voltage of MN1 and MN2 to VDDCORE. Additional core devices MP1 and MP2 included in the input stage 302 are operative to assist in pulling up a differential output of the voltage level translator circuit 300 at nodes N5 and N6.

Voltage level translator circuit 300 can be used to translate input signals (e.g., signals A and AN) referenced to a lower core supply voltage, such as, for example, VDDCORE, to an output signal, OUT, which is referenced to a higher supply voltage, such as, for example, VDDIO. In many applications, the lower core supply voltage VDDCORE is typically about 1.0 volt and the higher supply voltage VDDIO is typically about 1.8 volts. It is to be appreciated, however, that the present invention is not limited to these or to any other particular voltage levels for VDDCORE and VDDIO. Furthermore, the techniques of the present invention may be similarly employed to translate an input signal referenced to a higher supply voltage (e.g., VDDIO) to an output signal referenced to a lower core supply voltage (e.g., VDDCORE), as will be understood by those skilled in the art.

Traditional mixed signal integrated circuit processes typically offer both "high voltage" (i.e., IO) and "low voltage" (i.e., core) transistor devices. High voltage devices generally have a nominal threshold voltage of about 0.75 volts and are intended to operate with the higher supply voltage VDDIO (e.g., about 1.8 volts). Low voltage devices have a nominal threshold voltage which is substantially lower than the high voltage devices, such as, for example, about 0.35 volts, and are intended to operate with the lower core supply voltage VDDCORE (e.g., about 1.0 volt). As will be described in further detail below, voltage level translator circuit 300 employs both low voltage and high voltage transistor devices.

Voltage level translator circuit 300 comprises an input stage 302 adapted to receive two input signals A and AN, where A is preferably a logical complement of AN, referenced to a first voltage supply, which may be VDDCORE, and may therefore be considered a differential input stage. It is to be appreciated that in a single-ended mode of operation, input stage 302 may be operative to receive only one of the input signals A or AN. While the voltage level translator circuit 300 is not limited to a particular input stage configuration, input stage 302 preferably comprises first and second low voltage NMOS transistors, MN1 and MN2, respectively, first and second low voltage PMOS transistors, MP1 and MP2, respectively, and first and second high voltage NMOS transistors, MN3 and MN4, respectively. Sources of transistors MN1, MN2, MN3 and MN4 are adapted for connection with a third voltage supply, which may be VSS or ground (e.g., zero volts), gates of transistors MP1, MN1 and MN3 are connected together and adapted to receive a first input signal, A, at node N1, gates of transistors MP2, MN2 and MN4 are connected together and adapted to receive a second input signal, AN, at node N3, drains of MN1 and MN3 are connected with a drain of MP1 at node N2, drains of MN2 and MN4 are connected with a drain of MP2 at node N4, and sources of MP1 and MP2 are adapted for connection with VDDCORE.

In terms of operation, low voltage (core) transistors MP1 and MP1 in the input stage 302 assist in pulling up output nodes N5 and N6, as previously stated. Transistors MN3 and MN4 in input stage 302 are preferably high voltage (IO) devices which are operative to average the pull-down strength across PVT corners, such as, for example, when the high voltage transistor devices are fast and the low voltage transistor devices are slow.

Input signals A and AN are referenced to the first voltage supply, VDDCORE, which may be different than the voltage supply used to power the voltage level translator circuit. Signal AN is preferably a logical complement (i.e., inversion) of signal A, such that when signal A is a logic high level, signal AN is a logic low level, and vice versa. Signals A and AN may be generated, for example, by an inverter 303 including a low voltage PMOS transistor and a low voltage NMOS transistor (not explicitly shown) connected in a conventional manner. Inverter 303 is preferably powered by the same set of supply voltages (e.g., VDDCORE and VSS) to which the input signals A and AN are referenced. It is to be appreciated that inverter 303 is preferably operative to generate signal AN having substantially the same rise and fall times as signal A. Although shown as a single inverter stage for simplicity, inverter 303 may comprise more than one inverter stage, as will become apparent to those skilled in the art.

The voltage level translator circuit 300 is powered by higher supply voltage VDDIO and receives, as its negative voltage supply, VSS. The term "negative voltage supply" as used herein is intended to refer to a value of the voltage supply relative to VDDIO or VDDCORE, and does not necessarily refer to a voltage less than zero volts, although using a voltage less than zero volts is contemplated by the invention.

One benefit to utilizing low voltage transistors MN1, MN2, MP1 and MP2 is that the low voltage devices have a lower threshold voltage associated therewith, typically about 0.35 volt, compared to high voltage devices, which typically have a threshold voltage of about 0.75 volt, as previously stated. Consequently, the low voltage transistors MN1, MN2, MP1 and MP2 are able to provide the input stage 302 with additional overdrive so as to ensure proper operation of the voltage level translator circuit 300 over a desired range of PVT variations. The respective sizes of transistors MN1, MN2, MP1, MP2, MP3 and MP4 in the input stage 302 are preferably chosen so as to provide sufficient overdrive capability under substantially all expected worst case PVT corners of the voltage level translator circuit 300.

In order to protect the low voltage devices MN1, MN2, MP1 and MP2 from receiving the higher supply voltage VDDIO, voltage level translator circuit 300 preferably includes a voltage clamp circuit 304 connected between drains of devices MN1, MN2, MP1 and MP2 and a load circuit 306 with which input stage 302 is coupled. The voltage clamp circuit 304 preferably comprises a pair of high voltage NMOS transistors MN5 and MN6. Specifically, the drains of transistors MN1 and MP1 are connected to a source of transistor MN5 at node N2, and the drains of transistors MN2 and MP2 are connected to a source of transistor MN6 at node N4. A drain of device MN5 is connected with load circuit 306 at node N5, and a drain of device MN6 is connected with the load circuit at node N6. Gates of MN5 and MN6 are adapted to receive a control signal, which may be a bias signal, VT2, supplied to voltage level translator circuit 300 for clamping the respective drain voltages at nodes N2 and N4 to a desired voltage level. A magnitude of the bias signal VT2 is preferably selected to be about VDDCORE+Vtn, where Vtn is a threshold voltage of a high voltage NMOS transistor device.

Since transistors MN1, MN2, MP1 and MP2 are low voltage devices, they are generally not able to withstand the higher supply voltage VDDIO, voltage clamp circuit 304 preferably serves as a primary means for preventing the voltage at nodes N2 and N4 from exceeding a maximum specified voltage limit for the low voltage devices (e.g., about 1.26 volts for this exemplary embodiment), thereby protecting devices MN1, MN2, MP1 and MP2 from damage due to over-voltage stress. Preferably, the bias signal VT2 is selected so that the voltage levels at nodes N2 and N4 are never higher than the prescribed maximum allowable voltage on the low voltage devices MN1, MN2, MP1 and MP2. In a power-down mode of operation of the voltage level translator circuit 300, bias signal VT2 can be set, for example, to VSS (e.g., zero volt) so as to effectively turn off the voltage clamp circuit 304 and input stage 302 and to prevent nodes N2 and N4 from becoming undefined. Where VDDIO is already below the prescribed maximum allowable voltage for the low voltage devices MN1, MN2, MP1 and MP2, voltage clamp circuit 304 may be eliminated and nodes N2 and N4 connected directly with the load circuit 306.

Load circuit 306 preferably comprises high voltage PMOS transistor devices MP3, MP4, MP5 and MP6. Sources of devices MP3, MP4, MP5 and MP6 are adapted for connection to VDDIO, drains of MP3 and MP5 are connected to the drain of transistor MN5 in voltage clamp circuit 304 at node N5, drains of MP4 and MP6 are connected to the drain of transistor MN6 in the voltage clamp circuit at node N6, gates of MP5 and MP6 are adapted to receive a bias signal, PB, supplied to voltage level translator circuit 300, a gate of MP3 is connected with the drains of MP4 and MP6 at node N6, and a gate of MP4 is connected with the drains of MP3 and MP5 at node N5. Transistors MP5 and MP6 are beneficial during a power-down mode of operation. More particularly, during a power-down mode, bias signal PB will go to VSS and nodes N5 and N6 will both be set to VDDIO via transistors MP5 and MP6. In this manner, a power path between VDDIO and VSS is avoided during power-down mode.

Voltage level translator circuit 300 further includes an output stage 308 operatively connected with the level shift stage (including load circuit 306, voltage clamp circuit 304 and input stage 302). Output stage 308 may also function to generate a buffered output signal (e.g., signal OUT) of the voltage level translator circuit 300 having substantially rail-to-rail (e.g., VSS to VDDIO) logic levels. More particularly, output stage 308 comprises a high voltage PMOS transistor device, MP7, and a high voltage NMOS transistor device, MN7. A source of device MP7 is adapted for connection with VDDIO, a source of device MN7 is adapted for connection with VSS, drains of MP7 and MN7 are connected together and form an output of the voltage level translator circuit 300 at node N7 for generating an output signal, OUT, therefrom, and gates of MP7 and MN7 are connected with the level shift stage at node N5. Signal OUT is indicative of the input signal (s) (e.g., signals A and AN) supplied to the voltage level translator circuit 300. In this illustrative embodiment, output stage 308 is an inverting output stage. It is to be understood, however, that in alternative embodiments, output stage 308 may be non-inverting (e.g., a buffer). Additionally, output stage 308 is not limited to the specific inverter configuration shown.

A compensation circuit 310 included in the voltage level translator circuit 300 is operative to correct an imbalance between pull-up and pull-down propagation delays in the voltage level translator circuit. In comparison to the compensation circuit 208 in voltage level translator circuit 200 shown in FIG. 2, compensation circuit 310 provides a more symmetrical architecture by matching the load at node N5 attributable to output stage 308. Specifically, compensation circuit 310 comprises a first high voltage PMOS transistor device, MP9, having a source connected with the output stage 308 at node N7, a gate connected with the level shift stage at node N6, and a drain connected to VSS via a first resistor, R1. Transistor MP9 is thus controlled by the voltage, $V_{N6}$, at node N6. Resistor R1 is optionally included to provide electrostatic discharge (ESD) protection, since the drain of a PMOS device should not generally be connected directly to VSS. A value of resistor R1 is preferably selected to be about 200 ohms, although the invention is not limited to any specific resistance value.

Compensation circuit 310 further includes a dummy output stage comprising a high voltage PMOS transistor, MP8, and a high voltage NMOS transistor, MN8, configured as a standard inverter and connected with the level shift stage at node N6. More particularly, a source of transistor MP8 is adapted for connection with VDDIO, a source of transistor MN8 is adapted for connection with VSS, drains of MP8 and MN8 are connected together and form an output of the dummy output stage at node N8, and gates of MP8 and MN8 are connected with the level shift stage at node N6. Preferably, devices MP8 and MN8 in the dummy output stage are matched to devices MP7 and MN7 in output stage 308 so as to present substantially the same load on node N6 as the output stage presents on node N5. In applications requiring a differential output from voltage level translation circuit 300, dummy output stage may provide one of the complimentary differential output signals at node N8.

In order to provide essentially the same load at the output of the dummy output stage, compensation circuit 310 further includes a high voltage PMOS transistor device, MP10, having a source connected with the output of the dummy output stage at node N8, a gate connected with the level shift stage at node N5, and a drain connected to VSS via a second resistor, R2. Transistor MP10 is thus controlled by the voltage, $V_{N5}$, at node N5. Resistor R2 functions, at least in part, to linearize the pull-down current path at node N8; a value of resistor R2 is preferably selected to provide a prescribed pull-up and pull-down time constant (e.g., R2 is about 200 ohms). Transistor MP10 is preferably matched to transistor MP9 so that nodes N7 and N8 are substantially balanced in load relative to one another.

In terms of operation, the level shift stage (comprising input stage 302, voltage clamp circuit 304 and load circuit 306) functions in a manner consistent with the level shift stage (comprising input stage 202 and load circuit 204) in the voltage level translator circuit 200 shown in FIG. 2. The use of low voltage MOS transistors in the input stage 302 advantageously provides improved overdrive capability compared to input stage 202, but may require voltage clamp circuit 304 for device overvoltage protection as a trade-off. The operation of compensation circuit 310 will now be described in further detail.

More particularly, when input signal A is a logic high level (e.g., 1.0 volt), transistors MN1 and MN3 will turn on and transistor MP1 will turn off. Signal AN, being a logical complement of signal A, will be a logic low level (e.g., zero volt), and thus transistors MN2 and MN4 will turn off and transistor MP2 will turn on. With MN1 and MN3 turned on, transistor MN5 will turn on and node N5 will be pulled down to about VSS (e.g., zero volts), thereby turning on transistor MP4. With transistor MP2 turned on, node N4 will be pulled up to about VDDCORE. Assuming bias signal VT2 is less than VDDCORE+Vtn, transistor MN6 will turn off and will pass VDDCORE to node N6. Transistor MP4 will then charge node N6 to VDDIO, thus allowing node N6 to be pulled high (e.g., to about VDDIO) via transistor MP4. Node N6 being high will turn off transistor MP3, thereby latching the state of the voltage level translator circuit 300. With node N5 being low, the output signal OUT generated by output stage 308 will be a logic high (e.g., VDDIO).

Conversely, when input signal A is a logic low level, transistors MN1 and MN3 will turn off and transistor MP1 will turn on. Signal AN, being a logical complement of signal A, will be a logic high level, and thus transistors MN2 and MN4 will turn on and transistor MP2 will turn off. With MN2 and MN4 turned on, transistor MN6 will turn on and node N6 will be pulled down to about VSS (e.g., zero volts), thereby turning on transistor MP3. With transistor MP1 turned on, node N2 will be pulled up to about VDDCORE. Assuming bias signal VT2 is less than VDDCORE+Vtn, transistor MN5 will turn off and will pass VDDCORE to node N5. Transistor MP3 will then charge node N5 to VDDIO, thus allowing node N5 to be pulled high (e.g., to about VDDIO) via transistor MP3. Node N5 being high will turn off transistor MP4, thereby latching the state of the voltage level translator circuit 300. With node N5 being high, the output signal OUT generated by output stage 308 will be a logic low (e.g., VSS).

As was the case with voltage level translator circuit 200, the level shift stage (comprising input stage 302, voltage clamp circuit 304 and load circuit 306) responds more quickly in a pull-down direction than in a pull-up direction. Therefore, when input signal A is a logic high level and input signal AN is a logic low level, node N5 will be pulled down to VSS faster than node N6 will be pulled up to VDDIO. Since output stage 308 is connected with node N5, the output signal OUT, in the absence of compensation circuit 310, would otherwise transition from high to low more slowly compared to a transition from low to high, thus creating an imbalance between pull-up and pull-down propagation delay in voltage level translator circuit 300. However, compensation circuit 310 is operative to correct this imbalance between pull-up and pull-down propagation delays.

Specifically, transistor MP9 is controlled by the voltage ($V_{N6}$) appearing at node N6 rather than the voltage at node N5. Thus, as soon as node N6 is pulled to at least a threshold voltage below the output signal at node N7 (e.g., about VDDIO−$V_T$, where $V_T$ represents a high voltage MOS transistor threshold voltage), transistor MP9 will turn on and begin to pull down the output node N7 without having to wait for transistor MN7 in output stage 308 to turn on. Concurrently, when dummy output node N8 transitions from a logic low to a logic high level, transistor MP10, being controlled by the voltage ($V_{N5}$) appearing at node N5, will turn off more slowly (since node N5 will be slower to transition to a logic high level compared to node N6 transitioning to a logic low level), thus slowing the release of node N8 (i.e., MP10 will provide some resistance as transistor MP8 in the dummy output stage tries to pull up output node N8 against MP10). In this manner, transistor MP9 will speed the transition of node N7 from high to low and transistor MP10 will delay the transition of node N8 from low to high.

In the opposite direction, when signal OUT transitions from low to high, transistor MP9, being controlled by the voltage ($V_{N6}$) appearing at node N6, will turn off more slowly, thus slowing the release of output node N7 (i.e., MP9 will provide some resistance as transistor MP7 in output stage 308 tries to pull up output node N7 against MP9). Concurrently, transistor MP10 is controlled by the voltage ($V_{N5}$) appearing at node N5. Thus, as soon as node N5 is pulled to at least a threshold voltage below the voltage at node N8 (e.g., about VDDIO−$V_T$), transistor MP10 will turn on and begin to pull down dummy output node N8 without having to wait for transistor MN8 to turn on. In this manner, transistor MP9 will delay the transition of the output signal OUT at node N7 from low to high and transistor MP10 will speed the transition of node N8 from high to low, thereby beneficially providing pull-up and pull-down propagation delays that are substantially matched to one another.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1 through 3, or portions thereof, may be part of an integrated circuit. Integrated circuits so manufactured are considered part of this invention.

An integrated circuit in accordance with the present invention can be employed in essentially any application and/or electronic system in which voltage level translation is utilized. Suitable systems for implementing techniques of the invention may include, but are not limited, to interface devices (e.g., interface networks, high-speed memory interfaces (e.g., DDR3, DDR4), etc.), personal computers, communication networks, electronic instruments (e.g., automated test equipment (ATE), measurement equipment, etc.), etc. Systems incorporating such integrated circuits are considered part of this invention. Given the teachings of the invention provided herein, one of ordinary skill in the art will be able to contemplate other implementations and applications of the techniques of the invention.

Figure 4:
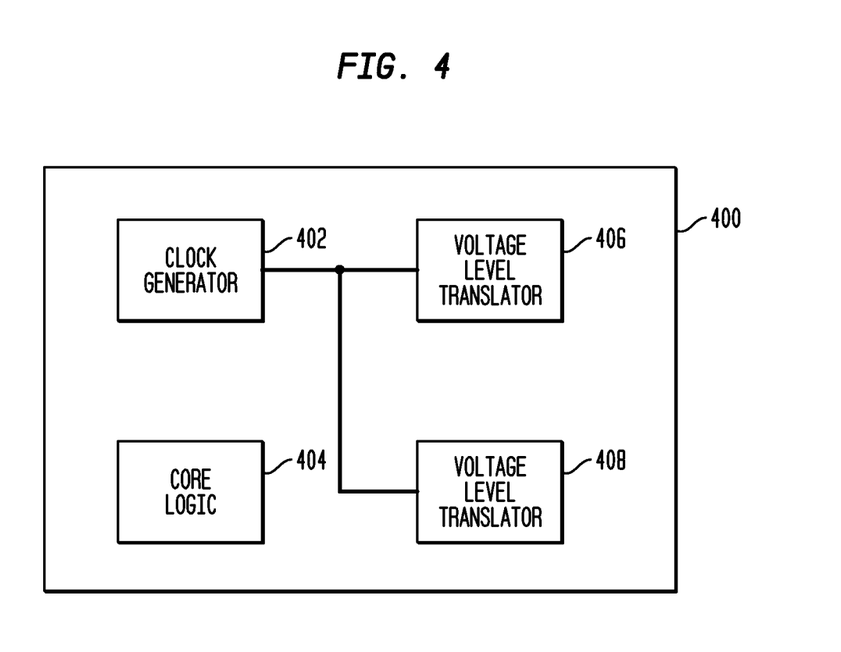
FIG. 4 is a block diagram depicting at least a portion of an exemplary electronic system including a plurality of voltage level translator circuits, according to an embodiment of the present invention.

For example, FIG. 4 is a block diagram depicting at least a portion of an exemplary electronic system 400, according to an embodiment of the present invention. System 400 includes, among other components, a clock generator block 402, core logic circuitry 404, and a plurality of voltage level translation circuits, 406 and 408, connected with the clock generator block. One or more of the voltage level translator circuits 406, 408 is configured in a manner consistent with any of the circuits depicted in FIGS. 2 and 3 for reducing jitter in one or more corresponding signals generated by the clock generator block 402 to which the voltage level translator circuits are coupled. Output signals generated by the respective voltage level translator circuits 406 and 408 may be employed by other circuit blocks (not explicitly shown) in the system 400, or, alternatively, such output signals may be supplied to one or more other circuits external to the system, as will become apparent to those skilled in the art given the teachings herein.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A voltage level translator circuit for translating an input signal referenced to a first voltage supply to an output signal referenced to a second voltage supply, the circuit comprising:

an input stage for receiving the input signal, the input stage including at least first and second nodes, a voltage at the second node being a logical complement of a voltage at the first node;

a load circuit coupled with the input stage, the load circuit being operative to at least temporarily store a signal on at least one of the first and second nodes which is indicative of a logical state of the input signal;

at least a first output stage connected with the load circuit at the second node and being operative to generate an output signal of the voltage level translator circuit which is indicative of a logical state of the input signal; and a compensation circuit connected with the first output stage and being operative to balance pull-up and pull-down propagation delays in the voltage level translator circuit as a function of a voltage at the first node;

wherein the compensation circuit comprises a first PMOS transistor having a first source/drain connected with a first output of the voltage level translator circuit, a second source/drain adapted for connection with the voltage return of the voltage level translator circuit, and a gate connected with the first node of the load circuit.

2. The voltage level translator circuit of claim 1, wherein the input stage is a differential input stage operative to receive the input signal and a logical complement of the input signal.

3. The voltage level translator circuit of claim 2, wherein the input stage comprises first and second NMOS transistors, first source/drains of the first and second NMOS transistors being adapted for connection to a voltage return of the voltage level translator circuit, a gate of the first NMOS transistor being adapted to receive the input signal, a gate of the second NMOS transistor being adapted to receive the logical complement of the input signal, a second source/drain of the first NMOS transistor being connected with the load circuit at the first node, and a second source/drain of the second NMOS transistor being connected with the load circuit at the second node.

4. A voltage level translator circuit for translating an input signal referenced to a first voltage supply to an output signal referenced to a second voltage supply, the circuit comprising:

an input stage for receiving the input signal, the input stage including at least first and second nodes, a voltage at the second node being a logical complement of a voltage at the first node;

a load circuit coupled with the input stage, the load circuit being operative to at least temporarily store a signal on at least one of the first and second nodes which is indicative of a logical state of the input signal;

at least a first output stage connected with the load circuit at the second node and being operative to generate an output signal of the voltage level translator circuit which is indicative of a logical state of the input signal; and a compensation circuit connected with the first output stage and being operative to balance pull-up and pull-down propagation delays in the voltage level translator circuit as a function of a voltage at the first node;

wherein the input stage is a differential input stage operative to receive the input signal and a logical complement of the input signal, the input stage comprising first and second NMOS transistors, first source/drains of the first and second NMOS transistors being adapted for connection to a voltage return of the voltage level translator circuit, a gate of the first NMOS transistor being adapted to receive the input signal, a gate of the second NMOS transistor being adapted to receive the logical complement of the input signal, a second source/drain of the first NMOS transistor being connected with the load circuit at the first node, and a second source/drain of the second NMOS transistor being connected with the load circuit at the second node, and wherein the first and second NMOS transistors are low-voltage transistors, and wherein the input stage further comprises first and second low-voltage PMOS transistors, first source/drains of the first and second PMOS transistors being adapted for connection with the first voltage supply, a gate of the first PMOS transistor being adapted to receive the input signal, a gate of the second PMOS transistor being adapted to receive the logical complement of the input signal, a second source/drain of the first PMOS transistor being connected with the second source/drain of the first NMOS transistor, and a second source/drain of the second PMOS transistor being connected with the second source/drain of the second NMOS transistor.

5. The voltage level translator circuit of claim 4, wherein input stage further comprises third and fourth high-voltage NMOS transistors operative to average a pull-down strength of the voltage level translator circuit across a prescribed set of process, voltage and temperature (PVT) conditions to which the voltage level translator circuit may be subjected.

6. The voltage level translator circuit of claim 4, wherein input stage further comprises third and fourth high-voltage NMOS transistors, first source/drains of the third and fourth NMOS transistors being adapted for connection to the voltage return of the voltage level translator circuit, a gate of the third NMOS transistor being adapted to receive the input signal, a gate of the fourth NMOS transistor being adapted to receive the logical complement of the input signal, a second source/drain of the third NMOS transistor being connected with the load circuit at the first node, and a second source/drain of the fourth NMOS transistor being connected with the load circuit at the second node.

7. The voltage level translator circuit of claim 1, wherein the load circuit comprises at least first and second transistors connected in a cross-coupled latch configuration.

8. The voltage level translator circuit of claim 7, wherein the load circuit comprises first and second PMOS transistors, first source/drains of the first and second PMOS transistors being adapted for connection with the second voltage supply, a second source/drain of the first PMOS transistor being connected with the input stage at the first node, a second source/drain of the second PMOS transistor being connected with the input stage at the second node, a gate of the first PMOS transistor being connected with the second source/drain of the second PMOS transistor, and a gate of second PMOS transistor being connected with the second source/drain of the first PMOS transistor.

9. The voltage level translator circuit of claim 7, wherein the load circuit comprises third and fourth transistors, the third transistor being connected between the first node and the second voltage supply, the fourth transistor being connected between the second node and the second voltage supply, the third and fourth transistors being operative to set the first and second nodes, respectively, to a prescribed voltage level during a power-down mode of operation of the voltage level translator circuit as a function of at least a first control signal.

10. The voltage level translator circuit of claim 1, wherein the first output stage comprises an inverter having an input connected with the second node and an output for generating the output signal.

11. The voltage level translator circuit of claim 1, wherein the first output stage is non-inverting.

12. The voltage level translator circuit of claim 1, wherein the first output stage comprises a PMOS transistor and an NMOS transistor, a first source/drain of the PMOS transistor being adapted for connection with the second voltage supply, a second source/drain of the PMOS transistor being connected with a first source/drain of the NMOS transistor and forming a first output of the voltage level translator circuit for generating the output signal, a second source/drain of the NMOS transistor being adapted for connection with a voltage return of the voltage level translator circuit, and gates of the PMOS transistor and NMOS transistor being connected with the second node of the load circuit.

13. The voltage level translator circuit of claim 1, wherein the compensation circuit comprises a resistor connected in series between the second source/drain of the first PMOS transistor and the voltage return of the voltage level translator circuit.

14. The voltage level translator circuit of claim 1, wherein the compensation circuit comprises:
a second output stage connected with the load circuit at the first node, the second output stage being substantially matched to the first output stage; and
a second PMOS transistor having a first source/drain connected with a second output of the voltage level translator circuit, a second source/drain adapted for connection with the voltage return of the voltage level translator circuit, and a gate connected with the second node of the load circuit, the second PMOS transistor being substantially matched to the first PMOS transistor.

15. The voltage level translator circuit of claim 14, wherein the compensation circuit comprises a resistor connected in series between the second source/drain of the second PMOS transistor and the voltage return of the voltage level translator circuit.

16. The voltage level translator circuit of claim 1, further comprising a voltage clamp circuit connected between the input stage and the load circuit, the voltage clamp circuit being operative to limit a voltage across the input stage.

17. The voltage level translator circuit of claim 16, wherein the voltage clamp circuit is operative to set the voltage across the input stage to a prescribed voltage level as a function of at least a first control signal.

18. The voltage level translator circuit of claim 17, wherein the first control signal comprises a bias signal about equal to a transistor threshold voltage above the first voltage supply.

19. The voltage level translator circuit of claim 16, wherein the voltage clamp circuit comprises first and second NMOS transistors, gates of the first and second NMOS transistors being adapted to receive a first control signal, a first source/drain of the first NMOS transistor being connected with the first node of the load circuit, a first source/drain of the second NMOS transistor being connected with the second node of the load circuit, a second source/drain of the first NMOS transistor being connected with a first node of the input stage, and a second source/drain of the second NMOS transistor being connected with a second node of the input stage.

20. An integrated circuit comprising at least one voltage level translator circuit for translating an input signal referenced to a first voltage supply to an output signal referenced to a second voltage supply, the at least one voltage level translator circuit comprising:
an input stage for receiving the input signal, the input stage including at least first and second nodes, a voltage at the second node being a logical complement of a voltage at the first node;
a load circuit coupled with the input stage, the load circuit being operative to at least temporarily store a signal on at least one of the first and second nodes which is indicative of a logical state of the input signal;

at least a first output stage connected with the load circuit at the second node and being operative to generate an output signal of the at least one voltage level translator circuit which is indicative of a logical state of the input signal; and a compensation circuit connected with the first output stage and being operative to balance pull-up and pull-down propagation delays in the at least one voltage level translator circuit as a function of a voltage at the first node;

wherein the compensation circuit comprises a first PMOS transistor having a first source/drain connected with a first output of the voltage level translator circuit, a second source/drain adapted for connection with the voltage return of the voltage level translator circuit, and a gate connected with the first node of the load circuit.

21. An electronic system, comprising:

at least one integrated circuit, the at least one integrated circuit including at least one voltage level translator circuit for translating an input signal referenced to a first voltage supply to an output signal referenced to a second voltage supply, the at least one voltage level translator circuit comprising:

an input stage for receiving the input signal, the input stage including at least first and second nodes, a voltage at the second node being a logical complement of a voltage at the first node;

a load circuit coupled with the input stage, the load circuit being operative to at least temporarily store a signal on at least one of the first and second nodes which is indicative of a logical state of the input signal;

at least a first output stage connected with the load circuit at the second node and being operative to generate an output signal of the at least one voltage level translator circuit which is indicative of a logical state of the input signal; and a compensation circuit connected with the first output stage and being operative to balance pull-up and pull-down propagation delays in the at least one voltage level translator circuit as a function of a voltage at the first node;

wherein the compensation circuit comprises a first PMOS transistor having a first source/drain connected with a first output of the voltage level translator circuit, a second source/drain adapted for connection with the voltage return of the voltage level translator circuit, and a gate connected with the first node of the load circuit.

* * * * *